United States Patent [19]

Tsui et al.

[11] Patent Number: 5,412,260
[45] Date of Patent: May 2, 1995

[54] MULTIPLEXED CONTROL PINS FOR IN-SYSTEM PROGRAMMING AND BOUNDARY SCAN STATE MACHINES IN A HIGH DENSITY PROGRAMMABLE LOGIC DEVICE

[75] Inventors: Cyrus Y. Tsui, Los Altos; Albert L. Chan, Palo Alto; Kapil Shankar, Fremont; Ju Shen, Saratoga, all of Calif.

[73] Assignee: Lattice Semiconductor Corporation, Hillsboro, Oreg.

[21] Appl. No.: 106,263

[22] Filed: Aug. 13, 1993

Related U.S. Application Data

[63] Continuation-in-part of Ser. No. 695,356, May 3, 1991, Pat. No. 5,237,218.

[51] Int. Cl.6 ......................................... H03K 19/003
[52] U.S. Cl. .................................. 326/39; 371/22.3; 326/21
[58] Field of Search ................ 371/22.3; 307/443, 465

[56] References Cited

U.S. PATENT DOCUMENTS

| | | |
|---|---|---|
| 4,761,768 | 8/1988 | Turner et al. . |
| 4,766,569 | 8/1988 | Turner et al. . |
| 4,833,646 | 5/1989 | Turner et al. . |
| 4,852,044 | 7/1989 | Turner et al. . |
| 4,855,954 | 8/1989 | Turner et al. . |
| 4,857,774 | 8/1989 | El-Ayat et al. ................. 371/22.6 X |
| 4,870,302 | 9/1989 | Freeman ............... 307/465 |
| 4,876,466 | 10/1989 | Kondou et al. .................... 307/465 |
| 4,879,688 | 11/1989 | Turner et al. . |
| 4,887,239 | 12/1989 | Turner . |
| 4,896,296 | 1/1990 | Turner et al. . |
| 4,918,641 | 4/1990 | Jigour et al. .................... 307/465 X |
| 5,015,886 | 5/1991 | Choi et al. ...................... 307/443 X |
| 5,023,484 | 6/1991 | Pathak et al. ..................... 307/465 |
| 5,023,606 | 6/1991 | Kaplinsky ....................... 307/465 X |
| 5,027,011 | 6/1991 | Steele .............................. 307/465 |
| 5,072,138 | 12/1991 | Slemmer et al. ................. 307/443 X |
| 5,084,635 | 1/1992 | Toda et al. ........................ 307/465 |
| 5,105,388 | 4/1992 | Itano et al. ..................... 307/465 X |
| 5,113,093 | 5/1992 | Tashiro et al. .................... 307/465 |
| 5,225,724 | 7/1993 | Scarra et al. .................... 371/22.3 X |

*Primary Examiner*—David R. Hudspeth
*Attorney, Agent, or Firm*—Skjerven, Morrill, MacPherson, Franklin & Friel; Edward C. Kwok; E. Eric Hoffman

[57] ABSTRACT

A structure and a method to implement in-system programming (ISP) and boundary-scan testing in an integrated circuit using the same pins to control both functions. The SDI, SCLK, MODE and SDO connections required for in-system programming and the TDI, TCK, TMS and TDO connections required for boundary-scan testing are multiplexed such that they are provided from the same four pins. An in-system programming enable pin is used to control the multiplexing of these pins. In an alternative embodiment, both in-system programming and boundary-scan testing are performed using the same pins and the same state machine. The test logic architecture specified in IEEE Standard 1149.1-1990 is utilized. To implement the in-system programming instructions, the instruction register of Std. 1149.1-1990 is modified to include private instructions which perform the desired programming functions.

14 Claims, 7 Drawing Sheets

MULTIPLEXED CONTROL PINS FOR IN-SYSTEM PROGRAMMING AND BOUNDARY SCAN STATE MACHINES IN A HIGH DENSITY PROGRAMMABLE LOGIC DEVICE

CROSS-REFERENCE TO RELATED APPLICATION

This application is a continuation-in-part of application Ser. No. 07/695,356, filed May 3, 1991, U.S. Pat. No. 5,327,218 assigned to Lattice Semiconductor Corporation, which is scheduled to issue on Aug. 17, 1993.

FIELD OF THE INVENTION

This invention relates to the design of integrated circuits, and in particular, to the design of programmable logic devices.

BACKGROUND OF THE INVENTION

Unlike a conventional programmable logic device (PLD), an in-system programmable logic device (ISPLD) can be reprogrammed in place, i.e. without removal from the system in which it is deployed. The method of reprogramming a programmable logic device in place is known as in-system programming (ISP). The standard pins utilized in in-system programming include a serial data input pin (SDI), a serial data output pin (SDO), a select mode pin (MODE) and a shift clock pin (SCLK). In-system programming is discussed in application Ser. No. 07/695,356, filed May 3, 1991 and assigned to Lattice Semiconductor Corporation, which will issue as U.S. Pat. No. 5,237,218 on Aug. 17, 1993. This application is herein incorporated by reference.

U.S. Pat. No. 5,237,218 allows an in-system programmable logic device to be implemented using only one dedicated in-system programming pin (ISP bar). The additional in-system programming pins (MODE, SCLK, SDI and SDO) are made available by multiplexing pins which are used as functional pins (such as input pins) when not in in-system programming mode. The in-system programming is controlled by an instruction-based state machine. An instruction set is provided to control the in-system programming activities.

In integrated circuit testing, a technique called "boundary scan" has been developed in recent years. On Feb. 15, 1990, the Institute of Electrical and Electronics Engineers (IEEE) approved standard 1149.1-1990. This standard defines a standard test logic architecture for implementing boundary scan functions which can be included in an integrated circuit for the purpose of testing the integrated circuit. The test architecture is defined to include a test access port (TAP) having connections for a test clock pin (TCK), a test mode select pin (TMS), a test data input pin (TDI) and a test data output pin (TDO). The test architecture also includes a TAP controller (boundary-scan state machine). The state diagram of the TAP controller is shown in FIG. 1. The value shown adjacent to each state transition in FIG. 1 represents the signal present at TMS at the time of a rising edge at TCK. Finally, the test architecture includes an instruction register and a group of test data registers. The test data registers include at least a bypass register and a boundary-scan register. A block diagram of the test logic is illustrated in FIG. 2. IEEE Standard 1149.1-1990 is herein incorporated by reference.

Previously, in order to provide both in-system programming and standard test logic architecture in an integrated circuit (IC), eight pins were required. An example of a pin out of such an IC is illustrated in FIG. 3. The MODE, SDO, SDI, and SCLK pins provide the in-system programming functions and the TMS, TDO, TDI, and TCK pins provide the boundary-scan testing functions. Because the pins of an integrated circuit package are considered a scarce resource, minimizing the number of pins is highly desirable. Therefore, it is desirable to reduce the number of pins required for in-system programming and boundary-scan testing.

In addition, in-system programming and boundary-scan testing utilize different state machines to control each function. By eliminating one of these state machines, the silicon area required for such an IC would be reduced. Therefore, it is desirable to utilize the same state machine to control both in-system programming and boundary-scan testing.

SUMMARY OF THE INVENTION

In accordance with the present invention, a structure and a method are provided to implement in-system programming and boundary-scan testing in an integrated circuit using a common interface for both functions. This common interface (e.g. the sharing of a set of control pins) can be an interface invoking different state machines for boundary scan testing and in-system programming functions. The different state machines can be invoked according to the states of a control pin, or alternatively, according to a protocol of the control signals in a common physical interface. Such a common interface can also be an interface invoking a state machine executing an instruction set including different instructions for accomplishing boundary scan testing and in-system programming functions.

In one embodiment, an in-system programming pin is used to select the function. While the in-system programming pin is enabled, selected pins will be used for in-system programming purposes. If the in-system programming pin is not enabled, the same selected pins will be used for boundary-scan testing purposes.

In an alternative embodiment, both in-system programming and boundary-scan testing are performed using the same pins and the same state machine for both functions. A test logic architecture, similar to that specified in IEEE Standard 1149.1-1990, is utilized. To implement the in-system programming instructions, the instruction register of the test architecture is modified to include private instructions which perform the desired programming functions. Such private instructions are similar to those discussed in Chapter 7.3 of the IEEE Standard.

The present invention provides for both in-system programming and boundary-scan testing using only five dedicated pins.

The present invention is better understood upon consideration of the following detailed description and the accompanying drawings.

DETAILED DESCRIPTION

Figure 4:
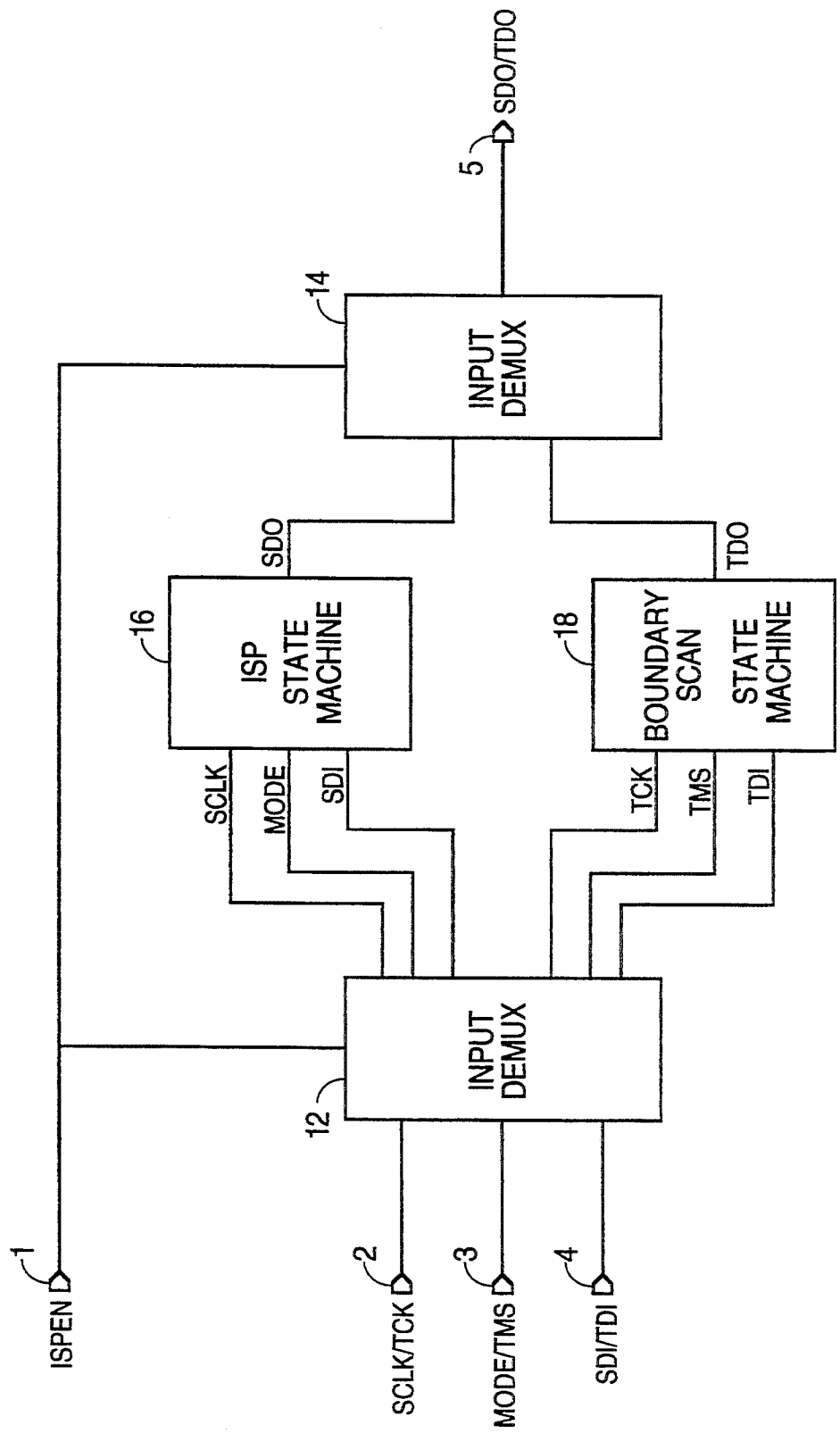
FIG. 4 shows a block diagram according to one embodiment of the present invention having enable pin ISPEN and multiplexed in-system programming-/boundary-scan test pins MODE/TMS, SCLK/TCK, SDI/TDI and SDO/TDO.

FIG. 4 shows five pins of an integrated circuit package of the present invention. These pins include ISPEN (in-system programming enable) pin 1, SDI/TDI pin 2, SCLK/TCK pin 3, MODE/TMS pin 4, and SDO/TDO pin 5. The ISPEN pin 1 is coupled to input demultiplexer 12 and output multiplexer 14. When the signal on ISPEN pin 1 is high, the circuit operates in the in-system programming mode. That is, the input demultiplexer 12 routes the signals on SCLK/TCK pin 2, MODE/TMS pin 3, and SDI/TDI pin 4, through to the ISP state machine 16 along the lines labeled SCLK, MODE and SDI, respectively. In addition, the high signal on ISPEN pin 1 causes the output multiplexer 14 to route the output (SDO) of the ISP state machine 16 through to SDO/TDO pin 5.

When the signal on ISPEN pin 1 is low, the circuit may operate in either a boundary-scan test mode or a normal user mode. If the ISPEN pin 1 is low and there is a clock signal applied to SCLK/TCK pin 3, the integrated circuit operates in boundary-scan test mode. When the ISPEN pin 1 is low and there is no signal on SCLK/TCK pin 3, the integrated circuit operates in a normal user mode.

When the circuit is operating in a boundary-scan test mode, the input demultiplexer 12 routes the signals on SCLK/TCK pin 2, MODE/TMS pin 3 and SDI/TDI pin 4 to the boundary-scan state machine 18 along the lines labeled TCK, TMS and TDI, respectively. In addition, the low signal on ISPEN pin 1 causes the output multiplexer 14 to route the output (TDO) of the boundary-scan state machine 18 through to SDO/TDO pin 5.

Figure 5A:
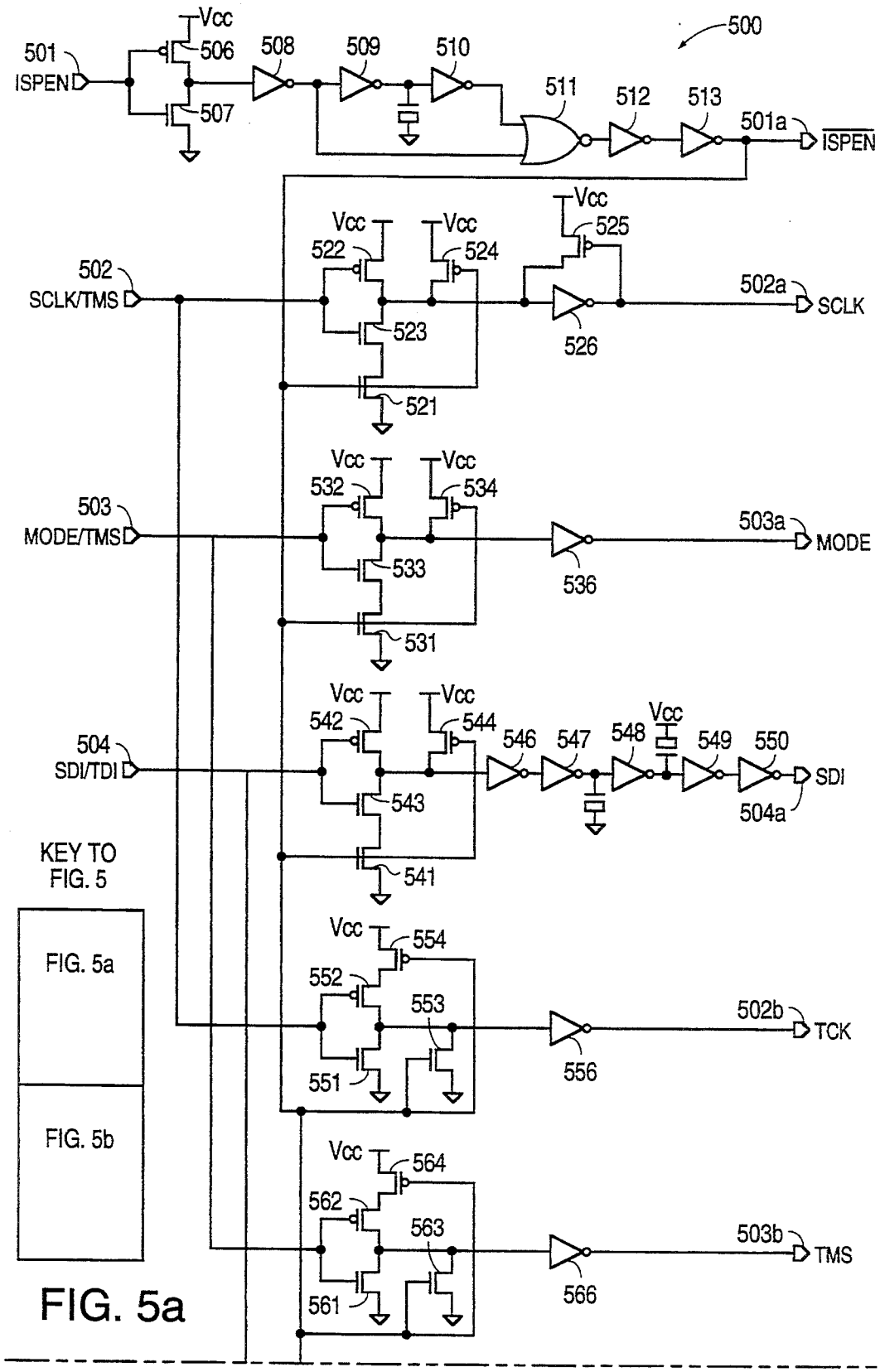
FIG. 5, which includes FIGS. 5a and 5b oriented as illustrated in the key to FIG. 5, shows one embodiment of the demultiplexer block of FIG. 4.
Figure 5B:
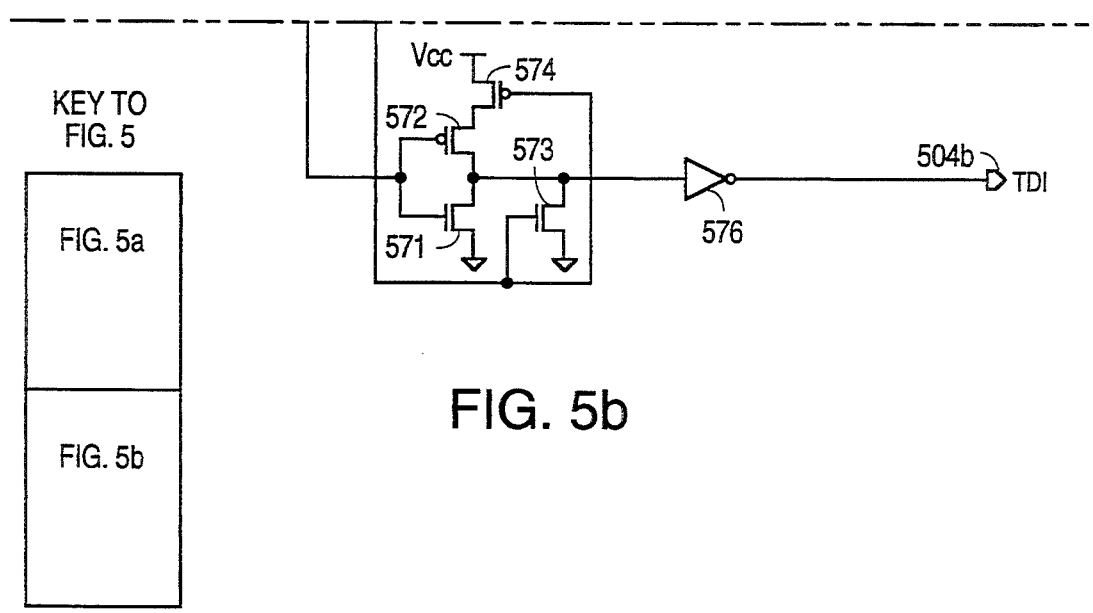

While the demultiplexing function may be performed in numerous ways, one demultiplexing circuit 500 is shown in FIG. 5. In FIG. 5, ISPEN pin 501, SCLK/TCK pin 502, MODE/TMS pin 503, and SDI/TDI pin 504 are external pins of an integrated circuit chip. SCLK node 502a, MODE node 503a, and SDI node 504a represent connections within the chip to ISP state machine 16. TCK node 502b, TMS node 503b, and TDI node 504b, represent connections within the chip to boundary scan state machine 18.

When the ISPEN pin 501 is in a logic low state, the boundary scan state machine 18 is enabled as follows. The signal on the ISPEN pin 501 is inverted by an inverter formed by transistors 506 and 507, and again inverted by inverter 508. The output of inverter 508 is provided directly to one terminal of NOR gate 511. The output of inverter 508 is also amplified by two inverters 509 and 510 before being provided to the other terminal of NOR gate 511. The output of NOR gate 511 is connected to inverters 512 and 513. Consequently, the inverse of the signal applied at ISPEN pin 501 appears at $\overline{ISPEN}$ node 501a. A high signal on ISPEN pin 501 therefore results in a low signal at $\overline{ISPEN}$ node 501a.

When $\overline{ISPEN}$ node 501a is in a logic low state, pull-up transistors 524, 534 and 544 are turned on. Consequently, the $V_{cc}$ voltage is supplied through transistor 524 to inverter 526, resulting in a logic low state at SCLK node 502a. Similarly, the $V_{cc}$ voltage is supplied through transistors 534 and 544, to inverter 536 and to inverters 546–550, respectively, resulting in logic low states at MODE node 503a and SDI node 504a.

A high signal on ISPEN pin 501 also causes transistors 521, 531 and 541 to remain off. As a result, the inverter formed by transistors 522–523, the inverter formed by transistors 532–533 and the inverter formed by transistors 542–543 are turned off.

As a result, the signals present on SCLK node 502a, MODE node 503a and SDI node 504a are not responsive to the signals on SCLK/TCK pin 502, MODE/TMS pin 503 or SDI/TDI pin 504.

In the lower portion of FIG. 5, the logic high signal on ISPEN pin 501 (logic low on $\overline{ISPEN}$ node 501a) causes transistors 554, 564 and 574 to turn on. These transistors enable the inverter formed by transistors 551–552 the inverter formed by transistors 561–562, and the inverter formed by transistors 571–572, respectively. In addition, transistors 553, 563 and 573 are brought to a nonconductive state by the logic low signal on $\overline{ISPEN}$ node 501a. Consequently, the signals on SCLK/TCK pin 502, MODE/TMS pin 503 and SDI/TDI pin 504 are transmitted to TCK node 502b, TMS node 503b and TDI node 504b, respectively. For example, the signal on SCLK/TCK pin 502 is first inverted by transistors 551–552, and then inverted by inverter 556 such that the original signal is provided to TCK node 502b.

When the signal on ISPEN pin 501 is low, the ISP state machine 16 is enabled as follows. As previously described, the signal on the ISPEN pin 501 is inverted by elements 506–513, resulting in a logic high signal at $\overline{ISPEN}$ node 501a.

When the $\overline{ISPEN}$ node 501a is at logic high, pull-up transistors 524, 534 and 544 are turned off and transistors 521, 531 and 541 are turned on. Consequently, transistors 521, 531 and 541 enable the inverter formed by transistors 522–523, the inverter formed by transistors 532–533, and the inverter formed by transistors 542–543, respectively. As a result, the signals on SCLK/TCK pin 502, MODE/TMS pin 503 and SDI/TDI pin 504 are inverted by transistors 522–523, transistors 532–533 or transistors 542–543, respectively. The signal originating on SCLK/TCK pin 502 is again inverted by inverter 526 such that the signal on SCLK/TCK pin 502 is transmitted to SCLK node 502a. The signal originating on MODE/TMS pin 503 is further inverted by inverter 536 such that the signal on MODE/TMS pin 503 is transmitted to MODE node 503a. The signal on SDI/TDI pin 504 is further inverted by inverters 546–550 such that the signal on SDI/TDI pin 504 is transmitted to SDI node 504a.

In the lower portion of FIG. 5, transistors 554, 564 and 574 are turned off by the logic high signal on $\overline{ISPEN}$ node 501a. This disables the inverter formed by transistors 551–552, the inverter formed by transistors 561–562, and the inverter formed by transistors 571–572. In addition, transistors 553, 563 and 573 are brought to a conductive state, thereby supplying inverters 556, 566 and 576 with a ground voltage. Consequently, TCK node 502b, TMS node 503b, and TDI node 504b are all brought to a logic high state and are not responsive to any signals on SCLK/TCK pin 502, MODE/TMS pin 503 or SDI/TDI pin 504.

One embodiment of ISP state machine 16 is disclosed in the co-pending application, Ser. No. 07/695,356, which is incorporated by reference.

While operating in the boundary-scan mode, the boundary-scan state machine 18 operates according to IEEE Standard 1149.1-1990. Using the above described configuration, the ISP state machine 16 and the boundary-scan state machine 18 may be implemented with five dedicated pins on the integrated circuit package.

Figure 1:
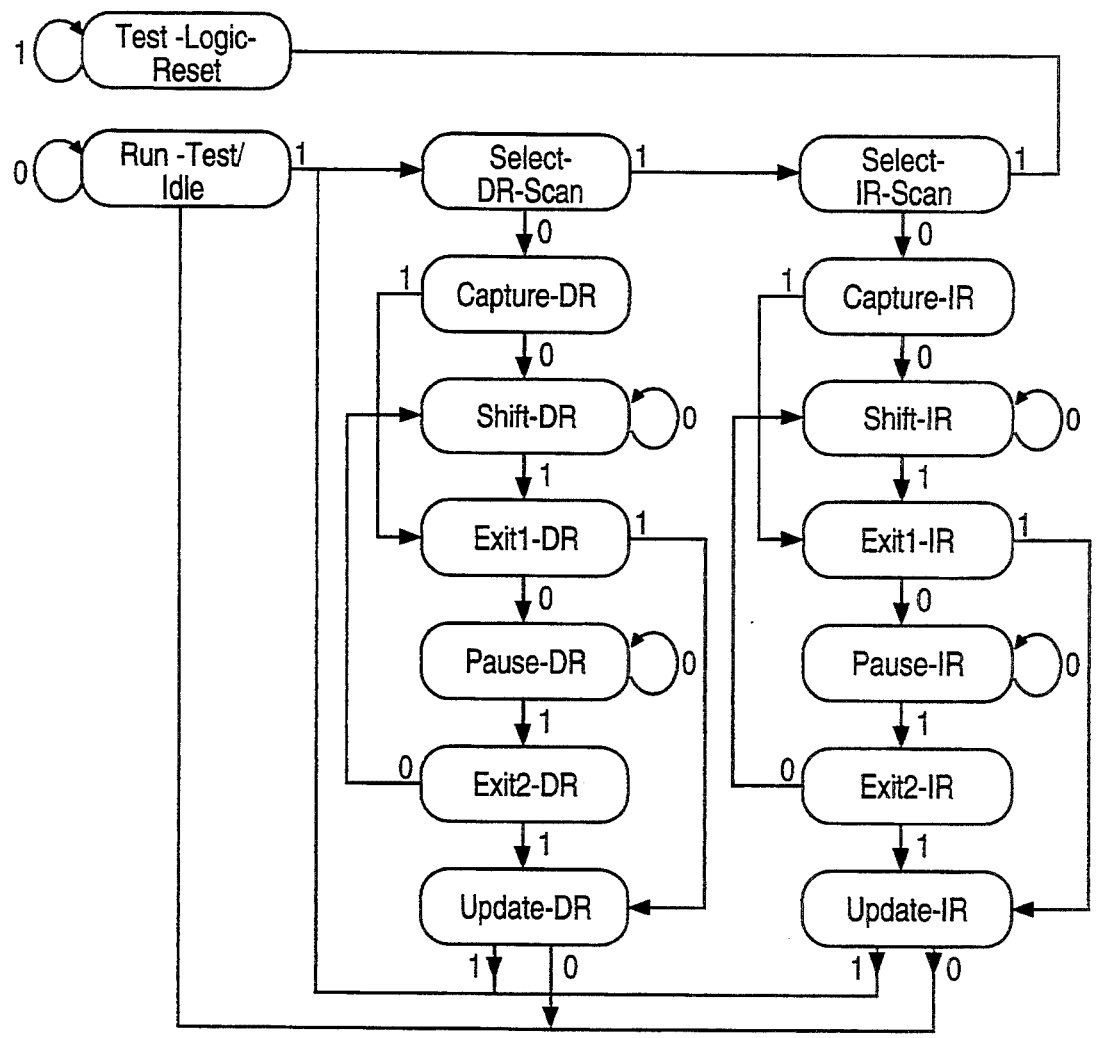
FIG. 1 shows the state diagram of a TAP controller under IEEE Standard 1149.1-1990.
Figure 2:
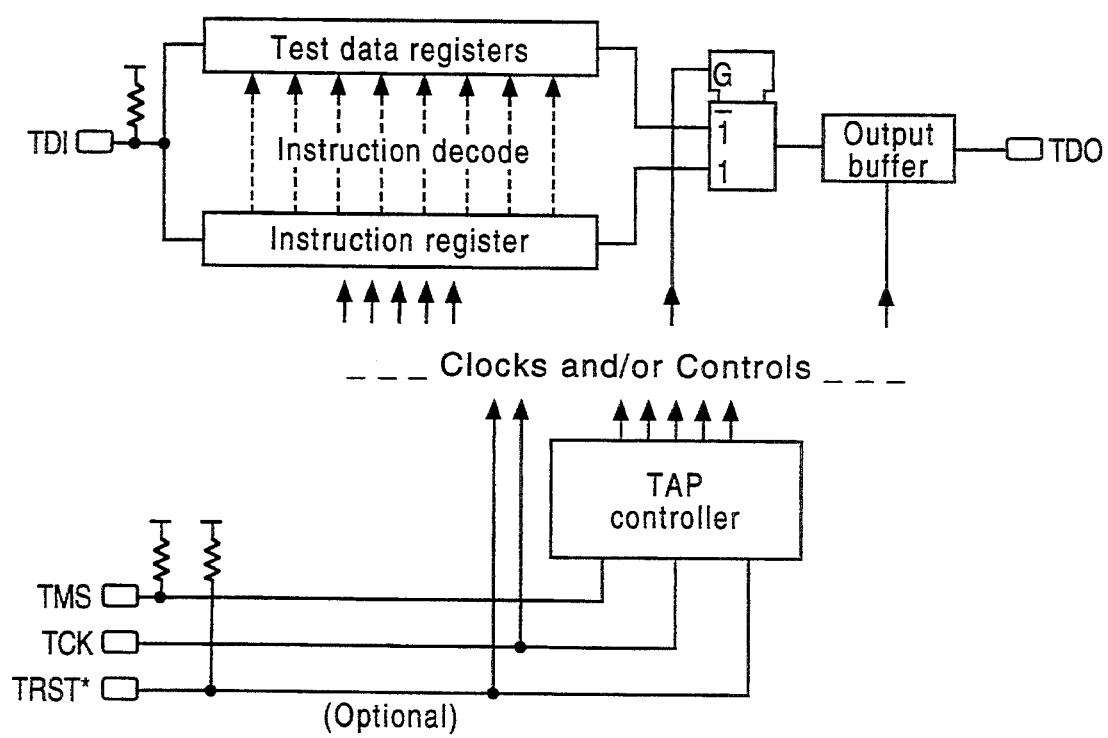
FIG. 2 shows a block diagram of the boundary-scan test logic according to IEEE Standard 1149.1-1990.
Figure 3:
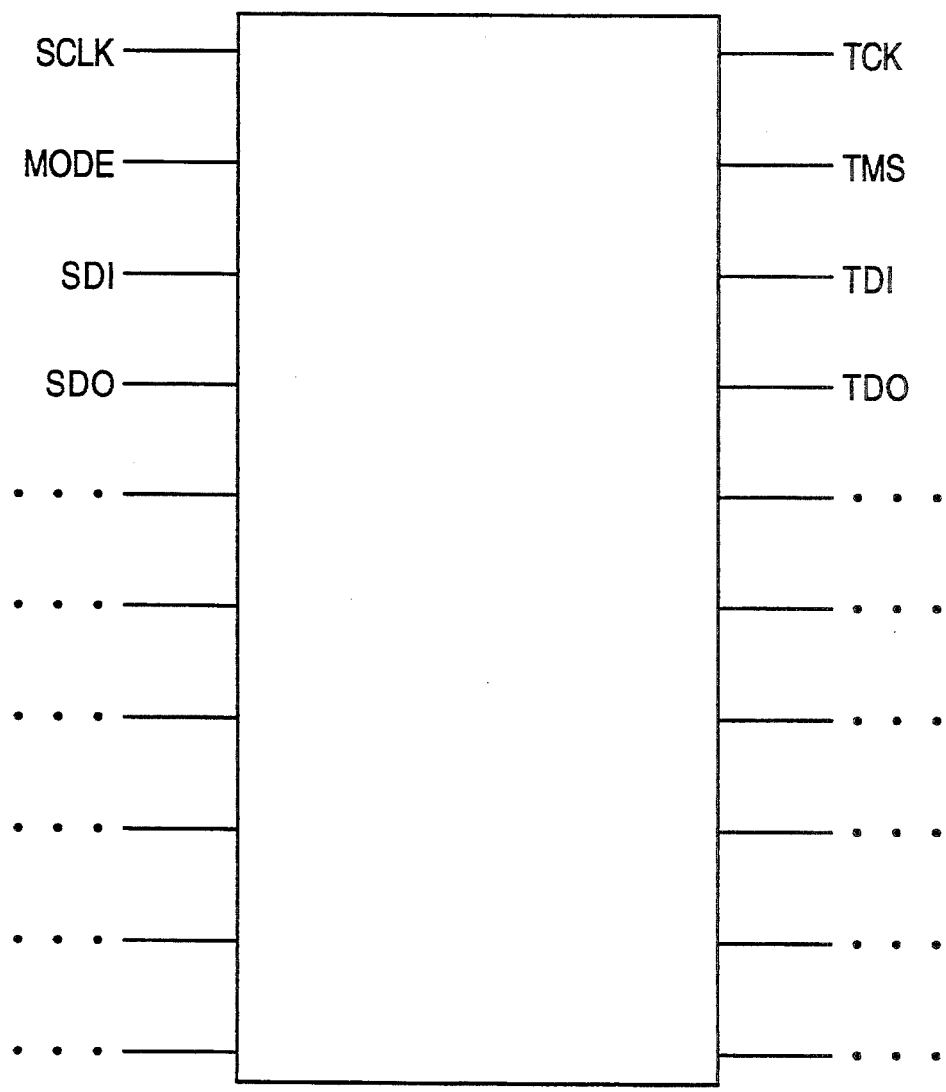
FIG. 3 shows a pin-out diagram of a prior art in-system programmable logic device (ISPLD) having in-system programming pins, MODE, SCLK, SDI and SDO and boundary-scan testing pins TMS, TCK, TDI and TDO.
Figure 6:
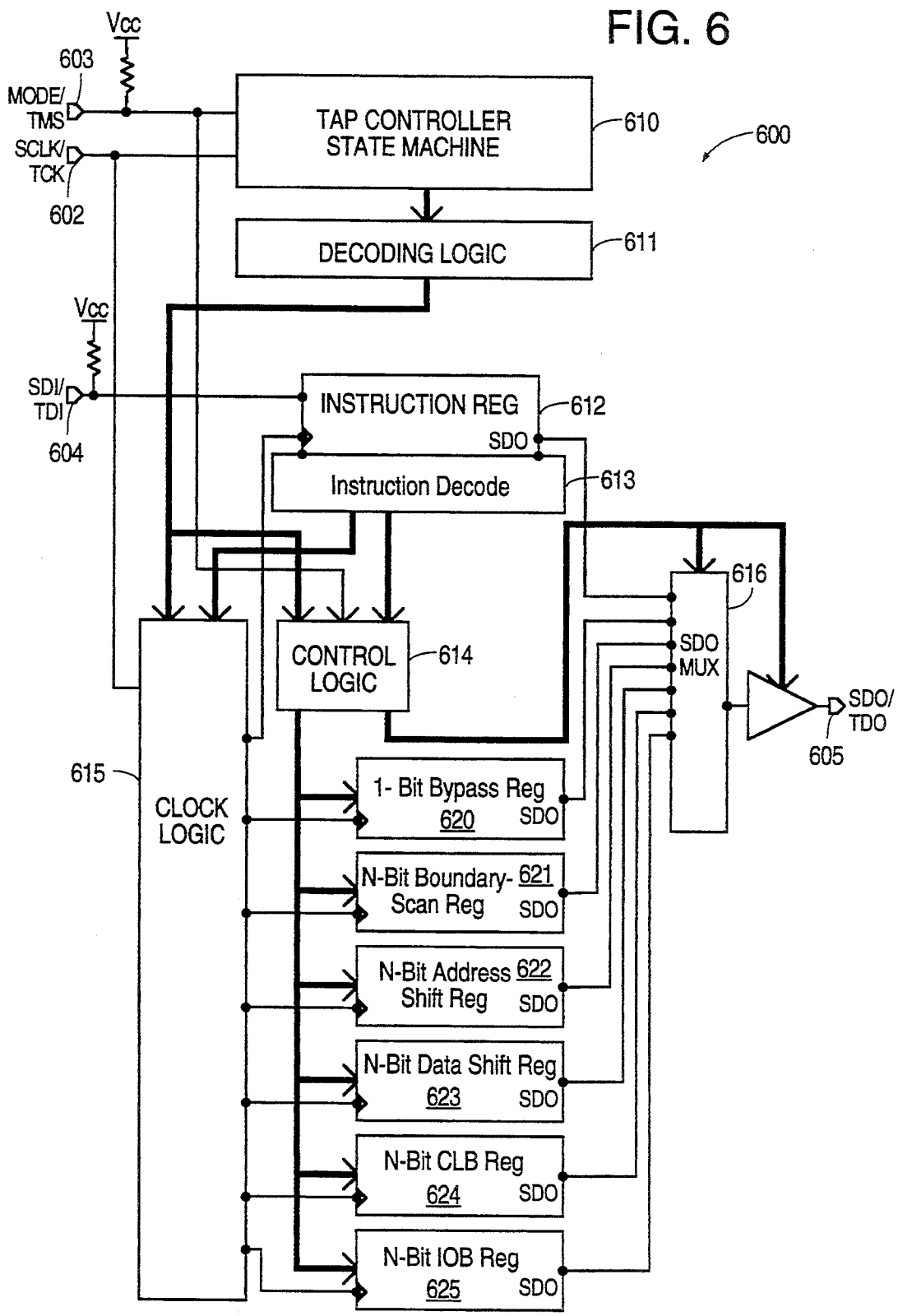
FIG. 6 shows a block diagram according to another embodiment of the present invention.

FIG. 6 illustrates a control circuit 600 of an alternative embodiment of the present invention. In this embodiment, a boundary-scan state machine is implemented in accordance with IEEE Standard 1149.1-1990. Thus, the state diagram of the tap controller state machine 610 is set forth in FIG. 1. The state of the tap controller state machine 610 is decoded by decoding logic block 611. The decoded state is used to control clock logic block 615, and control logic block 614. Also in accordance with IEEE Standard 1149.1-1990, instruction register 612, instruction decode 613, bypass register 620, boundary-scan register 621, TCK pin 602, TMS pin 603, TDI pin 604 and TDO pin 605 are provided. The control circuit 600 of this embodiment is "instruction-based". Thus, instructions are received from TDI pin 604 and shifted in accordance with the state of TAP controller 610 into instruction register 612. The instruction in instruction register 612 is decoded by control logic 614, which controls the various data registers 620, 621, 622, 623, 624 and 625. Each of these data registers is used in one or more instructions of control circuit 600. For example, when executing the bypass instruction, the control logic block 614 loads bit-serial data on TDI pin 604 into the 1-bit bypass register 620. This bit-serial data is shifted out of bypass register 620 is then transmitted to the TDO pin 605 through the SDO multiplexer 616. When executing an instruction relating to a boundary-scan test operation, bit-serial data on TDI pin 604 can be shifted into N-bit boundary scan register 621. The operation of boundary-scan register 621 follows the requirements defined for boundary scan operations in IEEE Standard 1149.1-1990.

In this embodiment, the tap controller 610 is also used to perform the in-system programming function. In order to perform in-system programming, the address shift register 622, the data shift register 623, the generic logic block (GLB) register 624 and the I/O register 625 are additionally provided. These registers are described in the copending application Ser. No. 07/695,356. Control logic block 614 controls these registers 622, 623, 624, 625 to perform in-system programming in accordance with the instruction in instruction register 612, as decoded by instruction decode logic 613. Because the tap controller state machine of this embodiment performs both the boundary-scan functions and the in-system programming, the ISPEN pin is not required. The multiplexing of pins 603–605 occurs within the circuit of FIG. 6 as the function of the circuit is switched from in-system programming to boundary-scan testing.

Chapter 7.3 of IEEE Standard 1149.1-1990 allows for private instructions which may be defined by the component manufacturer. The present invention uses these private instructions to provide the instructions used for in-system programming. The private instructions may consist of any binary code other than those codes used for the defined public instruction codes, BYPASS, SAMPLE/PRELOAD and EXTEST. The BYPASS code is defined as a logical "1" being entered into every instruction register cell. The EXTEST code consists of a logical "0" being loaded into every instruction register cell. The SAMPLE/PRELOAD code is not defined by the standard, but may be defined by the component designer. Therefore, all codes other than all 1's or all 0's may be used as private instructions. This flexibility allows the appropriate codes for in-system programming to be loaded into the instruction register. An example of a set of instructions for in-system programming is set forth in Table 1 below.

TABLE 1

In System Programming Instructions

| | | CMD |
|---|---|---|
| 0. NOP | No operation | 000001 |
| 1. ADDSHFT | Address register shift | 000010 |
| 2. DATASHFT | Data register shift | 000100 |
| 3. GBE | Global bulk erase Erase pia, array, architecture and security cells | 000110 |
| 4. PIABE | PIA bulk erase Erase pia cells | 001000 |
| 5. ARRBE | Array bulk erase Erase array cells | 001010 |
| 6. ARCHBE | Architecture bulk erase Erase architecture cells | 001100 |
| 7. PROGEVEN | Program even columns Program even columns of array, pia and architecture cells at the rows selected by Address SR | 001110 |
| 8. PROGODD | Program odd columns Program odd columns of array, pia and architecture cells at the rows selected by Address SR | 010000 |
| 9. SFPRG | Program security cell | 010010 |
| 10. VERIFYEVEN | Verify even columns programmed cells Verify even columns of array, pia and architecture programmed cells. Only one row can be selected for each verification | 010100 |
| 11. VERIFYODD | Verify odd columns programmed cells Verify odd columns of array, pia and architecture programmed cells. Only one row can be selected for each verification | 010110 |
| 12. GLCPRELD | Preload GLB registers | 011000 |
| 13. IOPRELD | Preload I/O cell registers | 011010 |
| 14. FLOWTHRU | Flow through SDI flow through to SDO | 011100 |
| 15. PROGESR | Program ESR Address SR is automatically cleared to 0 | 011110 |
| 16. ERAALL | Erase all Erase pia, array, architecture, ES and security cells | 100000 |
| 17. VERESR | Verify ESR Address SR is automatically cleared to 0 | 100010 |
| 18. VEREVENH | Verify even columns erased cells Verify even columns pia, array and architecture erased cells. Only one row can be selected for each verification | 100100 |
| 19. VERODDH | Verify odd columns erased cells Verify odd columns pia, array and architecture erased cells. Only one row can be selected for each verification | 100110 |
| 20. NOP | No operation | 101000 |
| . | . | . |
| 31. INIT | Initialize | 111110 |

The decoded instructions are provided from the instruction decode 613 to control logic 614. The control logic 614 directs the data received at TDI pin 604, according to the decoded instructions, into the selected one of address shift register 622, data shift register 623, GLB register 624 and input/output register 625. These four registers 622-625 perform the in-system programming of the chip. Clock logic block 615 provides the input clock signals for registers 612 and 620-625. The control logic block 614 and SDO multiplexer 616 operate to select which one of the registers 612, 620-625 will provide an output signal to TDO pin 605.

The above detailed description is provided to illustrate the specific embodiments of the present invention described herein. It is appreciated that one skilled in the art will be able to provide numerous modifications and variations within the scope of the present invention upon consideration of the detailed description and the accompanying drawings. For example, although the IEEE 1149.1-1990 standard is used to illustrate the above embodiments of the present invention, the present invention is applicable to any other test architecture using a serial input pin, a serial output pin and a clock pin. The present invention is defined by the following claims.

What is claimed is:

1. An in-system programmable logic device comprising a common interface for accessing boundary scan testing and in-system programming functions, wherein said common interface distinguishes boundary-scan testing and in-system programming functions using a control signal protocol applied to a set of pins of said common interface.

2. An in-system programmable logic device as in claim 1, wherein said common interface comprises a first pin for receiving an enable signal, said enable signal having a first state and a second state, said first state enabling in-system programming of said device and said second state enabling a boundary-scan test function of said device.

3. The in-system programmable logic device of claim 1, wherein said common interface invokes an in-system programming state machine to perform in-system programming functions and a boundary-scan state machine to perform boundary scan testing functions.

4. An in-system programmable logic device as in claim 1, wherein said common interface comprises a common state machine for performing both in-system programming of said device and boundary-scan testing said device, said state machine executing an instruction set including an instruction for an in-system programming function and an instruction for a boundary-scan testing function.

5. The in-system programmable logic device of claim 4, wherein said state machine uses an instruction register, said instruction register providing an instruction to perform said in-system programming of said device.

6. The in-system programmable logic device of claim 5, wherein said state machine further comprises,
an address shift register;
a data shift register;
a generic logic block (GLB) register; and
an input/output register;
wherein said address shift register, said data shift register, said GLB register and said input/output register receive said instructions from said instruction register.

7. An in-system programmable logic device comprising a common interface for accessing boundary scan testing and in-system programming functions, wherein said common interface comprises:
a first pin for receiving an enable signal, said enable signal having a first state and a second state, said first state enabling in-system programming of said device and said second state enabling a boundary-scan test function of said device,
a second pin for receiving a mode input signal for performing in-system programming when said enable signal is in said first state, said second pin receiving a test mode select signal for performing a boundary-scan test function when in said second state;
a third pin for receiving a serial data input signal for performing in-system programming when said enable signal is in said first state, said third pin receiving a test data input signal for performing a boundary-scan test function when said enable signal is in said second state;
a fourth pin for receiving a shift clock signal for performing in-system programming when said enable signal is in said first state, said fourth pin receiving a test clock signal for performing a boundary-scan test function when said enable signal is in said second state; and
a fifth pin for providing a serial data output signal for performing in-system programming when said enable signal is in said first state, said fifth pin providing a test data output signal for performing a boundary-scan function when said enable signal is in said second state.

8. A method for controlling an in-system programmable logic device comprising the steps of:
providing a common interface for accessing boundary scan testing and in-system programming functions; and
invoking through said common interface alternatively said boundary scan testing functions and said in-system programming functions, according to one or more control signals in said common interface.

9. A method of controlling an in-system programmable logic device as in claim 8, wherein said step of invoking further comprises the steps of:
applying an enable signal having a first state and a second state to a first pin of said device;
accessing an in-system programming function of said device if said enable signal is in said first state; and
accessing a boundary-scan test function of said device if said enable signal is in said second state.

10. The method of claim 9, further comprising the steps of:
utilizing a signal on a second pin as a mode input signal for in-system programming when said enable signal is in said first state and utilizing said signal on said second pin as a test mode select signal for boundary-scan testing when said enable signal is in said second state;
utilizing a signal on a third pin as a serial data input signal for in-system programming when said enable signal is in said first state and utilizing said signal on said third pin as a test data input signal for boundary-scan testing when said enable signal is in said second state;
utilizing a signal on a fourth pin as a shift clock signal for in-system programming when said enable signal is in said first state and utilizing said signal on said fourth pin as a test clock signal for boundary-scan testing when said enable signal is in said second state; and utilizing a signal on a fifth pin as a serial data output signal for in-system programming when said enable signal is in said first state and utilizing said signal on said fifth pin as a test data output signal for boundary-scan testing when said enable signal is in said second state.

11. The method of claim 8 wherein said step of providing a common interface comprises the steps of:

providing an in-system programming state machine to perform in-system programming functions; and providing a boundary-scan testing state machine to perform boundary-scan testing functions.

12. A method for controlling an in-system programmable device as in claim 8, wherein said step of providing a common interface comprises the step of providing a state machine for perform both boundary-scan testing and in-system programming, said state machine executing instructions from an instruction set including an instruction for a boundary scan testing function and an instruction for an in-system programming function.

13. The method of claim 12, further comprising the step of loading an instruction register in accordance with said state machine to provide instructions to perform said in-system programming.

14. The method of claim 8, wherein said step of providing a common interface provides an interface distinguishing boundary-scan testing and in-system programming functions according to a control signal protocol applied to a set of control pins of said interface.

* * * * *